United States Patent
Cheng et al.

(10) Patent No.: US 9,899,441 B1
(45) Date of Patent: Feb. 20, 2018

(54) DEEP TRENCH ISOLATION (DTI) STRUCTURE WITH A TRI-LAYER PASSIVATION LAYER

(71) Applicant: Taiwan Semiconductor Manufacturing Co., Ltd., Hsin-Chu (TW)

(72) Inventors: Yu-Hung Cheng, Tainan (TW); Cheng-Lung Wu, Tainan (TW); Tung-I Lin, Tainan (TW); Yeur-Luen Tu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/337,224

(22) Filed: Oct. 28, 2016

(51) Int. Cl.
*H01L 31/0232* (2014.01)
*H01L 27/146* (2006.01)

(52) U.S. Cl.
CPC ...... *H01L 27/1463* (2013.01); *H01L 27/1462* (2013.01); *H01L 27/14621* (2013.01); *H01L 27/14627* (2013.01); *H01L 27/14645* (2013.01); *H01L 27/14689* (2013.01); *H01L 27/14698* (2013.01)

(58) Field of Classification Search
CPC ........ H01L 27/14621; H01L 27/14627; H01L 27/1464; H01L 27/1463; H01L 27/1462; H01L 27/14643

USPC .......................................................... 257/432
See application file for complete search history.

(56) References Cited

U.S. PATENT DOCUMENTS

| 9,252,008 B2 | 2/2016 | Tsai et al. | |
| 2012/0208353 A1* | 8/2012 | Quddus | H01L 21/28537 438/478 |
| 2015/0115397 A1* | 4/2015 | Cheng | H01L 29/0649 257/510 |

OTHER PUBLICATIONS

Tournier, et al. "Pixel-to-Pixel Isolation by Deep Trench Technology: Application to CMOS Image Sensor." Conference: IISW 2011, at Hokkaido, Japan, Jun. 2011.

* cited by examiner

*Primary Examiner* — Theresa T Doan
(74) *Attorney, Agent, or Firm* — Eschweiler & Potashnik, LLC

(57) ABSTRACT

A method for manufacturing a deep trench isolation (DTI) structure with a tri-layer passivation layer is provided. An etch is performed into a semiconductor substrate to form a trench. A first undoped semiconductor layer is formed by epitaxy lining surfaces of the semiconductor substrate that define the trench. A doped semiconductor layer is formed by epitaxy over and lining the first undoped semiconductor layer in the trench. A second undoped semiconductor layer is formed by epitaxy over and lining the doped semiconductor layer in the trench. A structure resulting from the method is also provided.

20 Claims, 9 Drawing Sheets

DEEP TRENCH ISOLATION (DTI) STRUCTURE WITH A TRI-LAYER PASSIVATION LAYER

BACKGROUND

Many modern day electronic devices (e.g., cameras, cellular telephones, computers, etc.) include image sensors. An image sensor may include an array of photodetectors and supporting logic. The photodetectors measure incident radiation (e.g., light) corresponding to an optical image and the supporting logic facilitates digital readout of the measurements. Further, an image sensor may be front-side illuminated (FSI) or backside illuminated (BSI).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
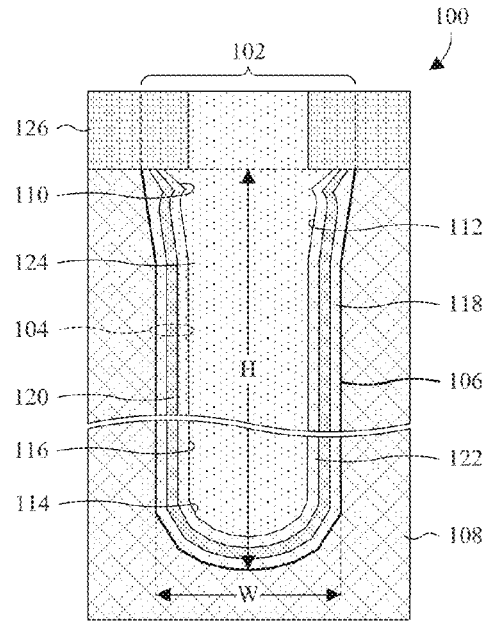
FIG. 1 illustrates a cross-sectional view of some embodiments of a deep trench isolation (DTI) structure with a tri-layer passivation layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For complementary metal-oxide semiconductor (CMOS) image sensors that are designed to sense near infrared radiation (NIR), deep trench isolation (DTI) structures with depths of between about 3-10 micrometers are often employed to isolate neighboring photodetectors of the CMOS image sensors. Further, during the manufacture of such CMOS image sensors, a DTI structure is often formed by forming a pad or hard mask layer over a semiconductor substrate and subsequently patterning the hard mask layer with a pattern of the DTI structure. Thereafter, an etch is performed into the semiconductor structure, with the hard mask layer in place, and a resulting trench is filled with a dielectric material.

A challenge with manufacturing the CMOS image sensors as described above is that the etch may extend laterally into the semiconductor substrate to undercut the hard mask layer. Such undercutting may increase dark current, which may, in turn, degrade performance (e.g., sensitivity) and/or result in white pixels. Another challenge with manufacturing the CMOS image sensors as described above is that the etch may result in crystalline defects on surfaces of the semiconductor substrate. Such crystalline defects may also increase dark current. One solution to this challenge is to implant dopants into the surfaces of the semiconductor substrate by ion implantation or plasma doping. However, where the etch extends to a depth greater than about 1 micrometer, it's challenging to uniformly implant the dopants along the surfaces of the semiconductor substrate from top to bottom.

The present disclosure relates to a method for forming a DTI structure with a tri-layer passivation layer, as well as the resulting structure. In some embodiments, an etch is performed into a semiconductor substrate to form a trench, and the tri-layer passivation layer is formed lining the trench. Forming the tri-layer passivation layer comprises forming a first undoped semiconductor layer, a doped semiconductor layer, and a second undoped semiconductor layer by selective epitaxy. The first undoped semiconductor layer is formed lining the trench, the doped semiconductor layer is formed over and lining the first undoped semiconductor layer in the trench, and second undoped semiconductor layer is formed over and lining the doped semiconductor layer in the trench. Further, in some embodiments, a baking process is performed before forming the tri-layer passivation layer, and/or a cyclic-deposition/etch (CDE) process is used to from the doped semiconductor layer.

Advantageously, forming the tri-layer passivation layer and performing the baking reduces undercutting and repairs crystalline defects in the semiconductor substrate. This, in turn, reduces dark, reduces white pixels, and increases performance. Further, forming the doped semiconductor layer by epitaxy advantageously allows the doped semiconductor layer to be formed with a uniform doping profile, from top to bottom, for trenches with depths greater than about 1 micrometers and/or aspect ratios greater than about 5. Even more, forming the doped semiconductor layer by CDE advantageously allows control over the doping profile of the doped semiconductor layer. Moreover, forming the tri-layer passivation layer with epitaxy allows the tri-layer passivation layer to be formed at low pressure (e.g., less than about 10 torr) and/or low temperature (e.g., about less than 700 degrees Celsius). This, in turn, may reduce the likelihood of damage to electronic devices on the semiconductor substrate and/or delamination of layers on the semiconductor substrate.

With reference to FIG. 1, a cross-sectional view 100 of some embodiments of a DTI structure 102 with a tri-layer passivation layer 104 is provided. As illustrated, the DTI structure 102 fills a trench 106 of a semiconductor substrate 108 to provide electrical and/or optical isolation between neighboring devices (not shown) in the semiconductor substrate 108. The neighboring devices may be, for example, photodetectors and/or active pixel sensors (APSs). The trench 106 may, for example, have a height H of about 3-10 micrometers, and/or may, for example, have a width W of about 60-2000 nanometers. Further, the trench 106 may, for example, have an aspect ratio (H/W) of about 5-50. The semiconductor substrate 108 may be, for example, doped and/or may be, for example, a bulk substrate of monocrystalline silicon or silicon germanium, some other bulk semiconductor substrate, a semiconductor-on-insulator (SOI) substrate, or some other semiconductor substrate.

The tri-layer passivation layer 104 lines the trench 106 and, in some embodiments, is confined to the trench 106. For example, the tri-layer passivation layer 104 may conformally line the trench 106 and/or may have an upper or top surface that is even with an upper or top surface of the semiconductor substrate 108. Further, in some embodiments, the tri-layer passivation layer 104 has a (111) facet 110, a top transient facet 112, bottom transient facets 114, and a (100) facet 116 facing an interior of the trench 106. The (111) facet 110 has a crystalline orientation of (111) and is arranged along a top of the trench 106. The top transient facet 112 transitions from the (111) facet 110 to the (100) facet 116 and may, for example, have an angle of about 80-90 degrees relative to a horizontal plane or the upper or top surface of the semiconductor substrate 108. The (100) facet 116 has a crystalline orientation of (100) and extends from the top transient facet 112 to the bottom transient facets 114. The tri-layer passivation layer 104 comprises a buffer layer 118, a doped semiconductor layer 120, and a capping layer 122. The buffer layer 118, the doped semiconductor layer 120, and the capping layer 122 may, for example, be conformal, and/or may, for example, have upper or top surfaces that are even with the upper or top surface of the semiconductor substrate 108.

The buffer layer 118 lines the trench 106 and is an undoped semiconductor material. In some embodiments, the buffer layer 118 is the same semiconductor material as the semiconductor substrate 108. The doped semiconductor layer 120 is arranged over and lines the buffer layer 118 and, in some embodiments, has a uniform doping concentration from top to bottom. For example, the doped semiconductor layer 120 may have a doping concentration of about 4e18 $cm^{-3}$ uniformly or substantially uniformly from top to bottom. Further, in some embodiments, the doped semiconductor layer 120 is the same semiconductor material as the semiconductor substrate 108 or the buffer layer 118, and/or is doped with the same dopants or doping type as the semiconductor substrate 108. Even more, in some embodiments, the doped semiconductor layer 120 is doped with p-type dopants, such as boron dopants. The capping layer 122 is arranged over and lines the doped semiconductor layer 120. Further, the capping layer 122 is an undoped semiconductor material and, in some embodiments is the same semiconductor material as the semiconductor substrate 108 and/or the buffer layer 118.

A dielectric filler layer 124 of the DTI structure 102 fills the trench 106 over the tri-layer passivation layer 104. The dielectric filler layer 124 may be, for example, silicon dioxide or some other dielectric material. In some embodiments, the dielectric filler layer 124 has an upper or top surface that is even with the upper or top surface of the semiconductor substrate 108. In other embodiments, the dielectric filler layer 124 has an upper or top surface that is even with an upper or top surface of a pad layer 126. The pad layer 126 is arranged over the semiconductor substrate 108, and overhangs the trench 106 while at least partially covering the tri-layer passivation layer 104. The pad layer 126 may, for example, have a pattern of the trench 106 and/or may, for example, have been used as a hard mask during formation of the trench 106. Further, the pad layer 126 may be or otherwise comprise, for example, silicon dioxide, silicon nitride, some other dielectric, or a multi-layer film comprising a combination of the foregoing. Advantageously, the tri-layer passivation layer 104 reduces undercutting of the pad layer 126, which may reduce dark and increase performance of the neighboring devices that are isolated from one another by the DTI structure 102.

Figure 2A:
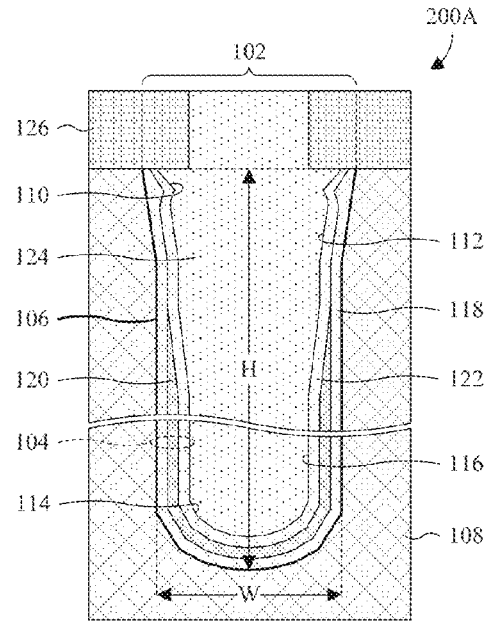
FIGS. 2A-2C illustrate cross-sectional views of some other embodiments of the DTI structure of FIG. 1.
Figure 2B:
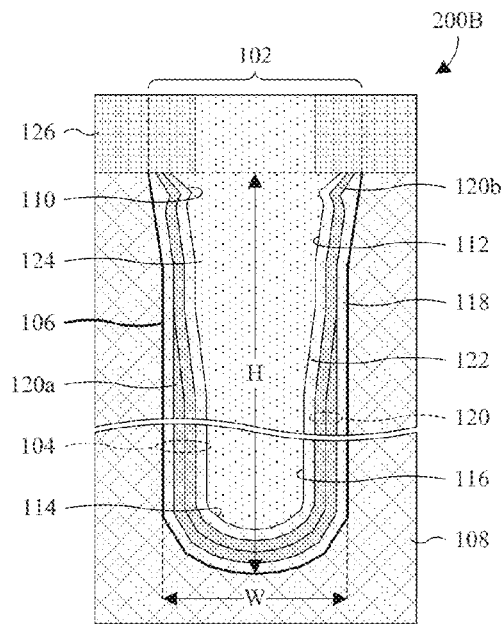
Figure 2C:
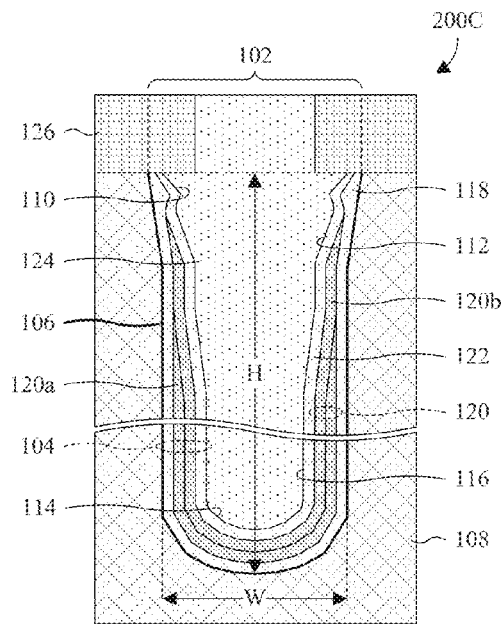

With reference to FIGS. 2A-2C, cross-sectional views 200A-200C of some other embodiments of the DTI structure 102 of FIG. 1 are provided. In these other embodiments of the DTI structure 102, the tri-layer passivation layer 104 may, for example, have a non-uniform doping concentration from top to bottom As illustrated by the cross-sectional view 200A of FIG. 2A, an upper or top surface of the doped semiconductor layer 120 is recessed below the upper or top surface of the semiconductor substrate 108. Since the buffer layer 118 and the capping layer 122 are undoped and define the tri-layer passivation layer 104 above the upper or top surface of the doped semiconductor layer 120, a doping concentration of the tri-layer passivation layer 104 increases from top to bottom. For example, the tri-layer passivation layer 104 may have a doping concentration less than about 4e18 $cm^{-3}$ over the upper or top surface of the doped semiconductor layer 120, and a doping concentration greater than about 4e18 $cm^{-3}$ below the upper or top surface of the doped semiconductor layer 120.

As illustrated by the cross-sectional view 200B of FIG. 2B, the doped semiconductor layer 120 is a multi-layer film comprising a plurality of doped semiconductor sublayers 120a, 120b that line and, in some embodiments, conformally line the buffer layer 118. For example, the doped semiconductor sublayers 120a, 120b may comprise a first doped semiconductor sublayer 120a arranged over and lining the buffer layer 118, and may further comprise a second doped semiconductor sublayer 120b arranged over and lining the first doped semiconductor sublayer 120a. In some embodiments, the doped semiconductor sublayers 120a, 120b are the same semiconductor material as the semiconductor substrate 108, and/or are doped with the same dopants or doping type as the semiconductor substrate 108. Further, in some embodiments, the doped semiconductor sublayers 120a, 120b are doped with p-type dopants.

The doped semiconductor sublayers 120a, 120b have individual doping concentrations that are uniform or substantially uniform from top to bottom, and that vary between the doped semiconductor sublayers 120a, 120b. For example, the doping concentrations may increase or decrease between the doped semiconductor sublayers 120a, 120b from a bottommost one of the doped semiconductor sublayers 120a, 120b to an innermost one of the doped semiconductor sublayers 120a, 120b. Further, the doped semiconductor sublayers 120a, 120b have individual upper or top surfaces that are recessed below the upper or top surface of the semiconductor substrate 108 to varying degrees. For example, the recesses of the upper or top surfaces of the doped semiconductor sublayers 120a, 120b may increase or decrease from a bottommost one of the doped semiconductor sublayers 120a, 120b to an innermost one of the doped semiconductor sublayers 120a, 120b. By varying the doping concentrations of the doped semiconductor sublayers 120a, 120b and/or the degrees to which the upper or top surfaces of the doped semiconductor sublayers 120a, 120b are recessed, the doping concentration of the tri-layer passivation layer 104 may advantageously be controlled.

In some embodiments, the doping concentrations of the doped semiconductor sublayers 120a, 120b, and the recessing of the upper or top surfaces of the doped semiconductor sublayers 120a, 120b, decrease from a bottommost one of the doped semiconductor sublayers 120a, 120b to an innermost one of the doped semiconductor sublayers 120a, 120b, such that the doping concentration of the tri-layer passivation layer 104 increases from top to bottom. For example, the first doped semiconductor sublayer 120a may have a higher doping concentration than the second doped semiconductor sublayer 120b, such that the tri-layer passivation layer 104 may have an increasing doping concentration from top to bottom.

Further, in some embodiments, the doping concentrations of the doped semiconductor sublayers 120a, 120b, and the recessing of the upper or top surfaces of the doped semiconductor sublayers 120a, 120b, increase from a bottommost one of the doped semiconductor sublayers 120a, 120b to an innermost one of the doped semiconductor sublayers 120a, 120b, such that the doping concentration of the tri-layer passivation layer 104 increases from top to bottom. For example, suppose the upper or top surface of the first doped semiconductor sublayer 120a is even with the upper or top surface of the semiconductor substrate 108, and the upper or top surface of the second doped semiconductor sublayer 120b is recessed below the upper or top surface of the semiconductor substrate 108. Further, suppose the first doped semiconductor sublayer 120a has a lower doping concentration than the second doped semiconductor sublayer 120b. In this example, the tri-layer passivation layer 104 may have an increasing doping concentration from top to bottom.

As illustrated by the cross-sectional view 200C of FIG. 2C, a variant of FIG. 2B is provided in which the doped semiconductor layer 120 is recessed below the upper or top surface of the semiconductor substrate 108. In embodiments where the doping concentrations of the doped semiconductor sublayers 120a, 120b, and the recessing of the upper or top surfaces of the doped semiconductor sublayers 120a, 120b, decrease from a bottommost one of the doped semiconductor sublayers 120a, 120b to an innermost one of the doped semiconductor sublayers 120a, 120b, the tri-layer passivation layer 104 has at least three different doping concentrations. A first doping concentration may, for example, be between the upper or top surfaces respectively of the semiconductor substrate 108 and the second doped semiconductor sublayer 120b. A second doping concentration greater than the first doping concentration may, for example, be between the upper or top surfaces respectively of the first and second doping semiconductor sublayers 120a, 120b. A third doping concentration greater than the second doping concentration may, for example, be below the upper or top surface of the first doped semiconductor sublayer 120a.

While FIGS. 2B and 2C provided examples of the doped semiconductor layer 120 that included two doped semiconductor sublayers 120a, 120b, it is to be appreciated that the doped semiconductor layer 120 may include additional doped semiconductor sublayers to further enhance the granularity with which the doping concentration of the tri-layer passivation layer 104 changes. For example, where the doped semiconductor layer 120 has 4 doped semiconductor sublayers configured as described in FIG. 2B or 2C, the tri-layer passivation layer 104 may respectively have 4 or 5 different doping concentrations from top to bottom.

Figure 3A:
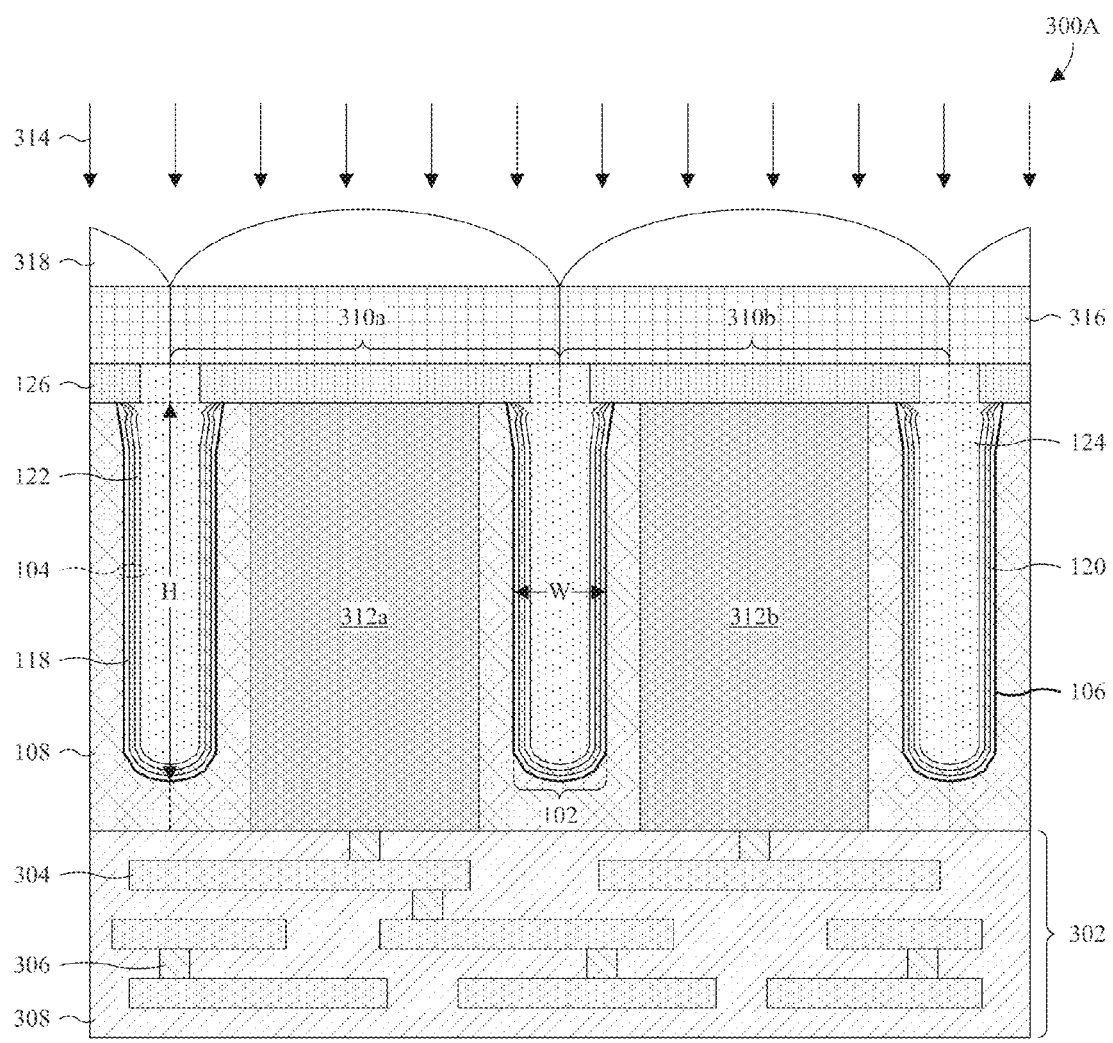
FIGS. 3A and 3B illustrate cross-sectional views of some embodiments of a complementary metal-oxide semiconductor (CMOS) image sensor having the DTI structure of FIG. 1.
Figure 3B:
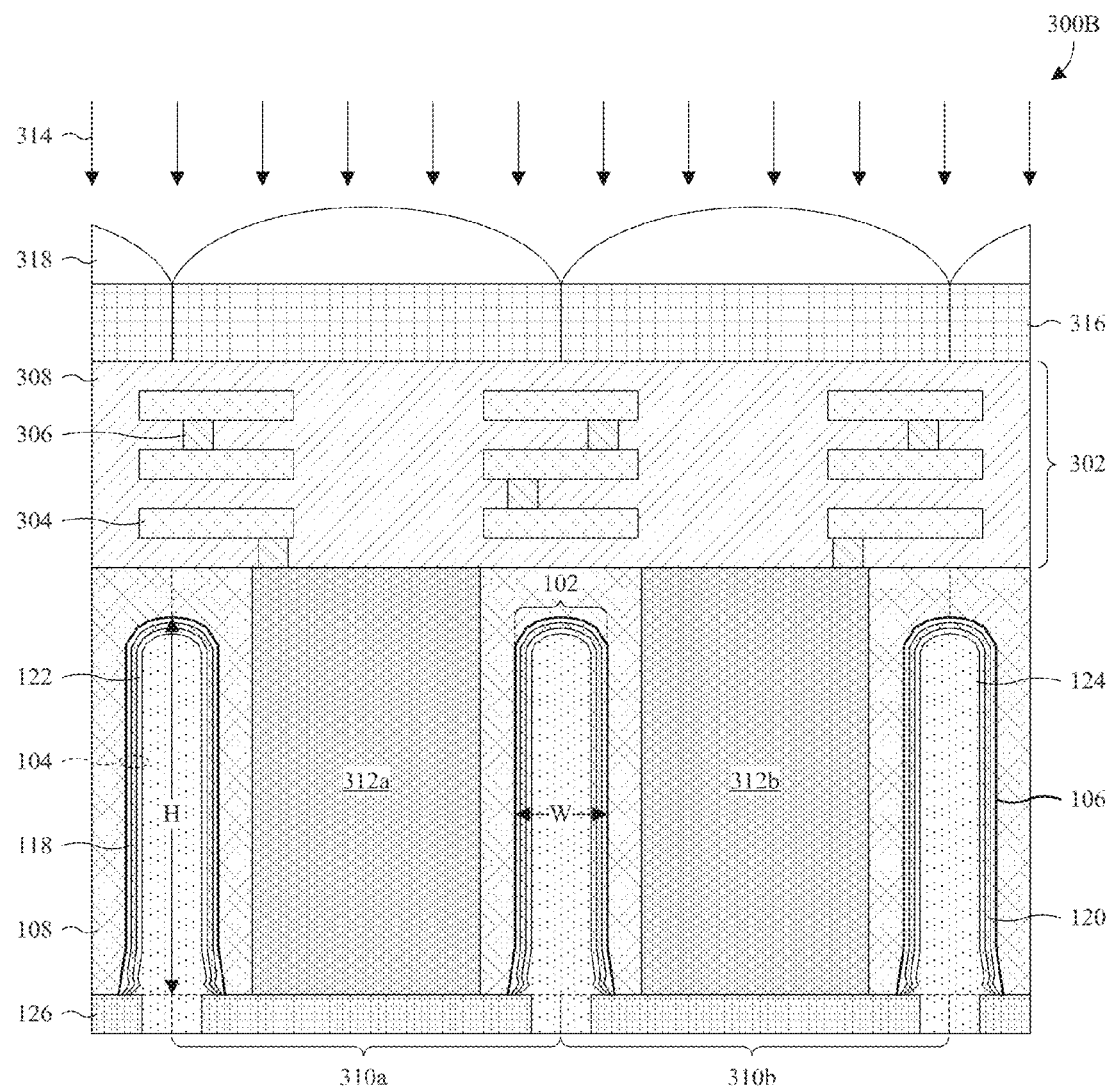

With reference to FIGS. 3A and 3B, cross-sectional views 300A, 300B of some embodiments of a CMOS image sensor having the DTI structure 102 of FIG. 1 is provided. The CMOS image sensor may be, for example, employed for sensing NIR. NIR may include, for example, radiation that has a wavelength within about 50 nanometers of infrared radiation, such as radiation with a wavelength of about 650 nanometers to about 1 millimeter.

As illustrated by the cross-sectional view 300A of FIG. 3A, the CMOS image sensor is backside illuminated (BSI) and comprises a back-end-of-the-line (BEOL) interconnect structure 302 arranged under a semiconductor substrate 108, on a front side of the semiconductor substrate 108. The BEOL interconnect structure 302 comprises a plurality of wiring layers 304 and a plurality of via layers 306 alternatingly stacked within a dielectric layer 308. The wiring and via layers 304, 306 may be, for example, copper, aluminum copper, tungsten, some other metal or conductive material, or a combination of the foregoing. The dielectric layer 308 may be, for example, silicon dioxide, a low κ dielectric, some other dielectric, or a combination of the foregoing. A low κ dielectric is a dielectric with a dielectric constant κ less than about 3.9.

The semiconductor substrate 108 comprises a plurality of pixel regions 310a, 310b demarcated and isolated by the DTI structure 102. In some embodiments, the pixel regions 310a, 310b are arranged in rows and/or columns. The pixel regions 310a, 310b accommodate individual photodetectors 312a, 312b configured to convert radiation 314 (e.g., radiation) incident thereon into electric signals. In some embodiments, the photodetectors 312a, 312b are or otherwise comprise photodiodes and/or correspond to APSs. The photodiodes may, for example, comprise respective p-type doped regions (not shown) of the semiconductor substrate 108, and may further comprise respective n-type doped regions (not shown) of the semiconductor substrate 108 that adjoin the respective p-type doped regions.

The DTI structure 102 fills a trench 106 extending into a backside of the semiconductor substrate 108, on an opposite side of the semiconductor substrate 108 as the front side of the semiconductor substrate 108. Further, the trench 106 and hence the DTI structure 102 extend laterally to enclose and demarcate the pixel regions 310a, 310b, such that the DTI structure 102 provides electrical and/or optical isolation between the pixel regions 310a, 310b. In some embodiments, the trench 106 has a height (or depth) H of about 3-10 micrometers, and/or has a width W of about 300 nanometers. The DTI structure 102 comprises a tri-layer passivation layer 104 and a dielectric filler layer 124.

The tri-layer passivation layer 104 lines the trench 106 and comprises a buffer layer 118, a doped semiconductor layer 120, and a capping layer 122. The buffer layer 118 lines the trench 106, the doped semiconductor layer 120 is arranged over and lines the buffer layer 118, and the capping layer 122 is arranged over and lines the doped semiconductor layer 120. The buffer layer 118 and the capping layer 122 are an undoped semiconductor material and may be, for example, undoped monocrystalline silicon. The doped semiconductor layer 120 is configured as described in FIG. 1 and may be, for example, monocrystalline silicon doped with boron or some other p-type dopants. Alternatively, the doped semiconductor layer 120 may be configured as described in FIGS. 2A-2C.

The dielectric filler layer 124 fills the trench 106 over the tri-layer passivation layer 104 and may, for example, have an upper or top surface that is even with an upper or top surface of a pad layer 126. The pad layer 126 is arranged over the semiconductor substrate 108, and overhangs the trench 106 while at least partially covering the tri-layer passivation layer 104. Advantageously, the tri-layer passivation layer 104 reduces undercutting of the pad layer 126, which may reduce dark current and increase performance of the photodetectors 312a, 312b.

A plurality of color filters 316 and/or microlenses 318 are arranged over the DTI structure 102 and the semiconductor substrate 108. The color filters 316 are configured to selectively transmit assigned wavelengths of radiation to corresponding ones of the pixel regions 310a, 310b. For example, a first color filter (e.g., a red color filter) may transmit light having wavelengths within a first range to a first pixel region 310a, while a second color filter may transmit light having wavelengths within a second range different than the first range to a second pixel region 310b. The microlenses 318 are configured to focus the radiation 314 on corresponding ones of the pixel regions 310a, 310b.

As illustrated by the cross-sectional view 300B of FIG. 3B, the CMOS image sensor is front-side illuminated (FSI). The color filters 316 and/or the microlenses 318 are arranged over the BEOL interconnect structure 302, on the front side of the semiconductor substrate 108. In operation, radiation 314 passes through the BEOL interconnect structure 302, the color filters 316, and the microlenses 318 to impinge on the photodetectors 312a, 312b. In some embodiments, the wiring layers 304 have openings or apertures over the individual photodetectors 312a, 312b so light isn't blocked by the wiring layers 304.

While the embodiments of FIGS. 3A and 3B illustrate the DTI structure 102 and the trench 106 as extending into the backside of the semiconductor substrate 108, the DTI structure 102 and the trench 106 may extend into the front side of the semiconductor substrate 108 in other embodiments. In some of such other embodiments, the pad layer 126 is arranged on the front side of the semiconductor substrate 108, between the BEOL interconnect structure 302 and the semiconductor substrate 108.

With reference to FIGS. 4-7, 8A-8C, and 9-12, a series of cross-sectional views 400-700, 800A-800C, 900-1200 of some embodiments of a method for manufacturing a DTI structure with a tri-layer passivation layer is provided.

Figure 4:
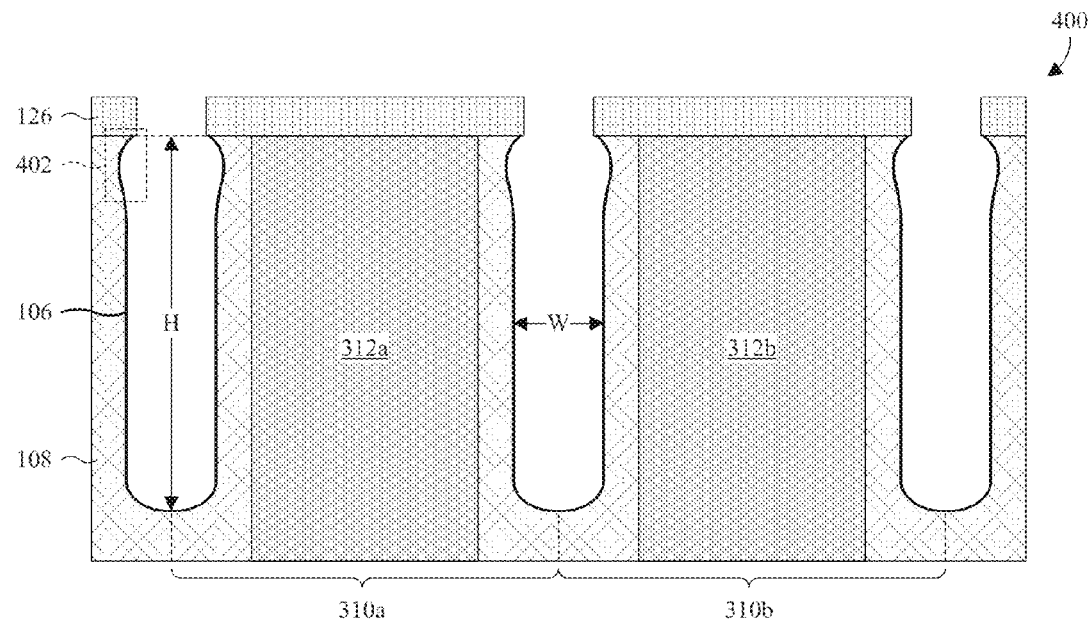
FIGS. 4-7, 8A-8C, and 9-12 illustrate a series of cross-sectional views of some embodiments of a method for manufacturing a DTI structure with a tri-layer passivation layer.

As illustrated by the cross-sectional view 400 of FIG. 4, a first etching process is performed to form a trench 106 laterally spacing and demcarating pixel regions 310a, 310b in the semiconductor substrate 108. In some embodiments, the trench 106 is formed with a height H of about 3-10 micrometers and/or with a width W of about 300 nanometers. Further, in some embodiments, the trench 106 is formed with an aspect ratio (H/W) of about 5-50. The pixel regions 310a, 310b respectively comprise photodetectors 312a, 312b, and the semiconductor substrate 108 may be, for example, a bulk substrate of monocrystalline silicon and/or may be, for example, doped with p-type dopants, such as boron dopants.

The first etching process comprises forming a pad layer 126 over the semiconductor substrate 108, and subsequently patterning the pad layer 126 with a pattern of the trench 106. The pad layer 126 may, for example, be formed of silicon oxide and/or silicon nitride, and/or may, for example, be formed using thermal oxidation, vapor deposition, or sputtering. The patterning may, for example, be performed using photolithography. Further, the first etching process comprises applying an etchant to the semiconductor substrate 108 with the pad layer 126 in place to form the trench 106 in the semiconductor substrate 108. The etchant may, for example, comprise arsenic and/or may, for example, be a dry etchant. In some embodiments, the first etching process is performed according to or otherwise using a deep reactive-ion etching (DRIE) process, such as, for example, a Bosch etching process.

In some embodiments, the first etching process results in a dielectric liner layer (not shown) lining the trench 106. The dielectric liner layer may, for example, be silicon dioxide and/or may, for example, conformally line the trench 106. In some embodiments where the first etching process results in the dielectric liner layer, the dielectric liner layer is removed. Such removal may, for example, be performed by applying an etchant to the dielectric liner layer that preferentially etches the dielectric liner layer relative to the semiconductor substrate 108. Further, in some embodiments, the first etching process results in defects with the trench 106. The defects may include, for example, crystalline defects on surfaces of the semiconductor substrate 108 defining the trench 106, undercutting of the pad layer 126, and bowing 402 along a top of the trench 106. The defects may, for example, increase dark current, degrade performance of the photodetectors 312a, 312b, or result in white pixels.

Figure 5:
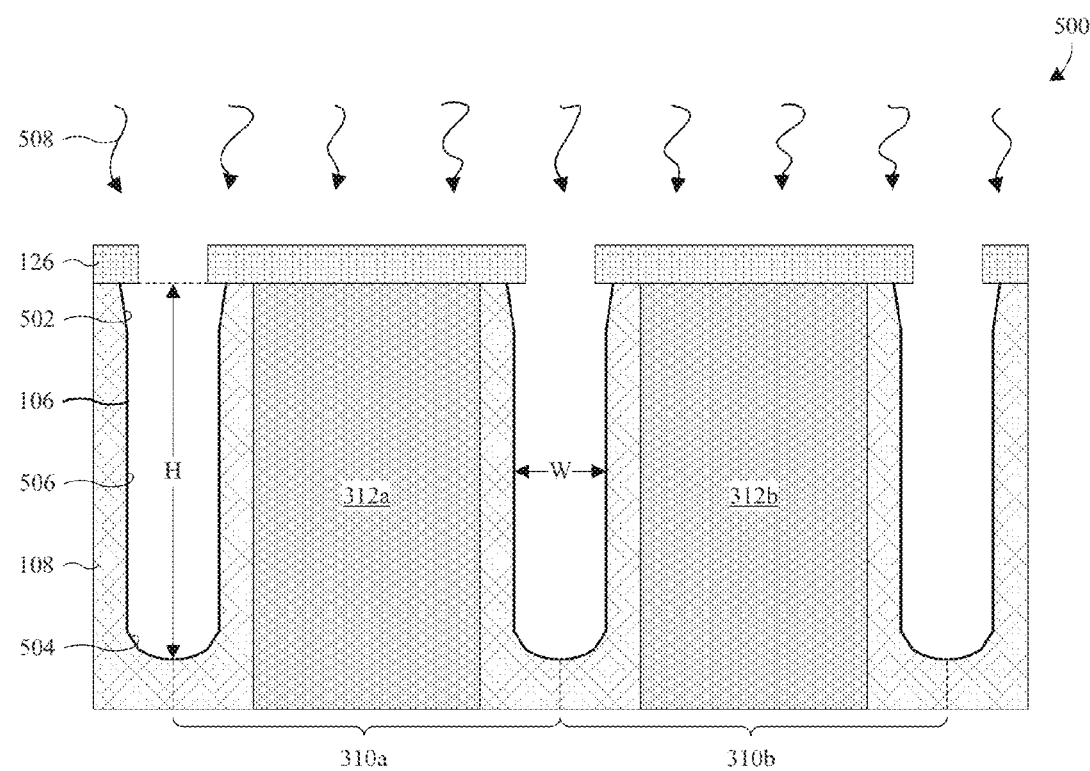

As illustrated by the cross-sectional view 500 of FIG. 5, a baking process is performed to repair crystalline defects on surfaces of the semiconductor substrate 108. Further, the baking process is performed to re-shape the profile of the trench 106 so as to reduce the undercutting of the pad layer 126. For example, the bowing 402 of FIG. 4 may be replaced with top transient facets 502, and/or a curved bottom of the trench 106 may be replaced with bottom transient facets 504. The top transient facets 502 extend from a top of the trench 106 to (100) facets 506, and the (100) facets 506 extend to the bottom transient facets 504. The top transient facets 502 may, for example, have an angle of about 80-90 degrees relative to horizontal or an upper or top surface of the semiconductor substrate 108, whereas the (100) facets 506 may, for example, be substantially vertical and have a crystalline orientation of (100). Advantageously, by reducing the crystalline defects and/or reducing the undercutting, dark current is reduced, performance of the photodetectors 312a, 312b is improved, and white pixels are reduced.

The baking process comprises heating the semiconductor substrate 108 through exposure to thermal radiation 508. For example, a process chamber within which the semiconductor substrate 108 is arranged may be heated to a high temperature greater than about 800 degrees Celsius, such as about 850 degrees Celsius. In some embodiments, the baking process is a hydrogen baking process, such that the semiconductor substrate 108 is heated in the presence of hydrogen gas. Further, in some embodiments, the baking process is performed at a low pressure less than about 10 or 11 torr, such as, for example, about 10.3 torr, and/or is performed for about 1-3 minutes, such as, for example, about 2 minutes.

In some embodiments, the baking process is performed in-situ with the first etching process. In other words, in some embodiments, the baking process is performed within the same process chamber used for the first etching process, and without first removing the semiconductor substrate 108 from the process chamber after the first etching process. By performing the baking processes in-situ, the semiconductor substrate 108 does not need to be transferred between process chambers between the baking and first etching processes, thereby reducing costs. Further, the likelihood of the semiconductor substrate 108 coming into contact with contaminants and/or oxidizing may be reduced since the process chamber is often controlled.

Figure 6:
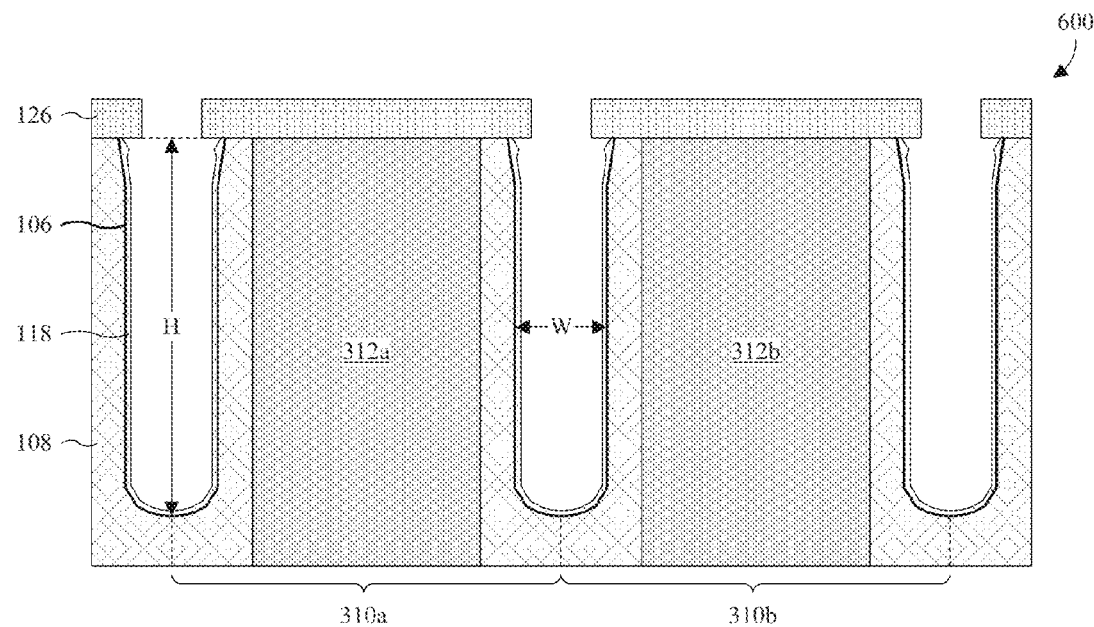

As illustrated by the cross-sectional view 600 of FIG. 6, a buffer layer 118 is formed lining surfaces of the semiconductor substrate 108 that define the trench 106 and, in some embodiments, is confined to the trench 106. For example, the buffer layer 118 may be formed conformally lining the trench 106 and/or with an upper or top surface that underlies the pad layer 126. Further, the buffer layer 118 is formed of an undoped semiconductor material. For example, the buffer layer 118 may be formed of undoped monocrystalline silicon and/or as the same semiconductor material as the semiconductor substrate 108.

The process for forming the buffer layer 118 may be, for example, an epitaxial deposition or growth process, such as metalorganic chemical vapor deposition (MOCVD), molecular beam epitaxy (MBE), or hydride vapor phase epitaxy (HVPE). Further, the epitaxial deposition or growth process may be, for example, selective, such that the buffer layer 118 forms on semiconductor material, such as the semiconductor substrate 108, but not on other materials, such as the pad layer 126. In some embodiments, the selective epitaxial deposition or growth process is performed by vapor deposition in which vapor comprising hydrogen chloride (e.g., HCl) and dichlorosilane (e.g., DCS) is flowed over the semiconductor substrate 108. In some embodiments, the vapor is flowed over the semiconductor substrate 108 for about 80-120 seconds, such as about 100 seconds. Further, in some embodiments, the vapor is flowed over the semiconductor substrate 108 at a low temperature less than about 700 or 800 degrees Celsius and/or a low pressure less than about 10 or 11 torr. For example, the vapor may be flowed over the semiconductor substrate 108 at a temperature of about 650-750 degrees Celsius and/or at a pressure of about 10.0-10.5 torr. Even more, in some embodiments, the flowrate for dichlorosilane is about 3-6 times, such as about 5 times, greater than that of hydrogen chloride. For example, the flowrate for dichlorosilane may be 150 standard cubic centimeters per minute (sccm), and/or the flowrate for hydrogen chloride may be 30 sccm.

Figure 7:
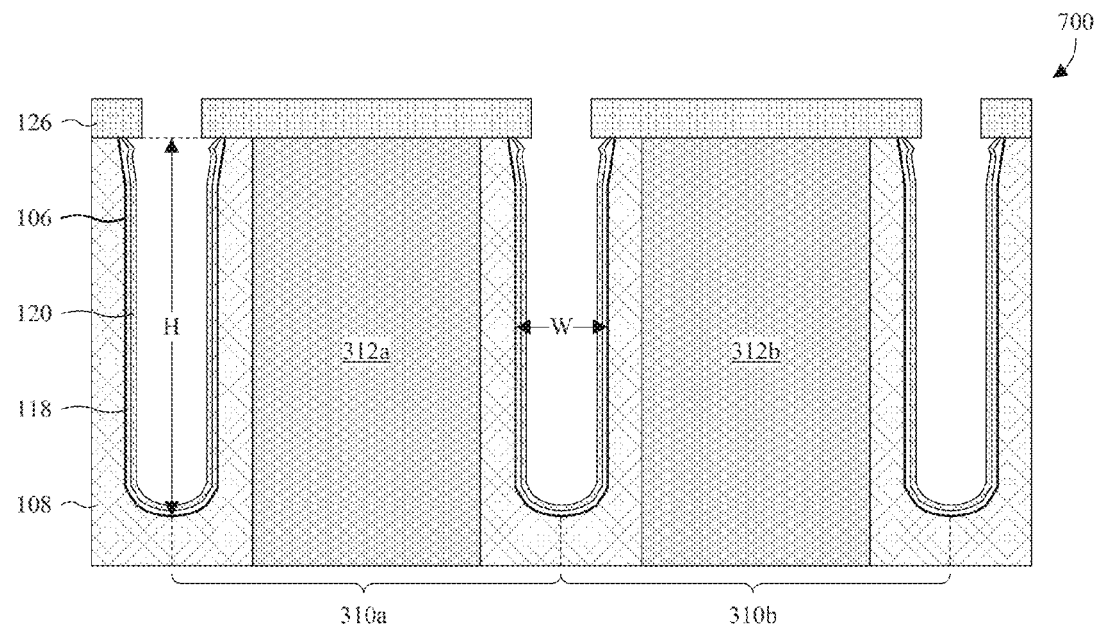

As illustrated by the cross-sectional view 700 of FIG. 7, a doped semiconductor layer 120 is formed lining the buffer layer 118 and, in some embodiments, confined to the trench 106. For example, the doped semiconductor layer 120 may be formed conformally lining the buffer layer 118 and/or with an upper or top surface that underlies the pad layer 126. In some embodiments, the doped semiconductor layer 120 is formed with a doping concentration that is uniform from top to bottom. For example, the doped semiconductor layer 120 may be formed with a doping concentration of about 4e-18 $cm^{-3}$ that is uniform from top to bottom. Further, in some embodiments, the doped semiconductor layer 120 is formed of boron-doped monocrystalline silicon. Even more, in some embodiments, the doped semiconductor layer 120 is formed of the same semiconductor material as the semiconductor substrate 108 and/or the buffer layer 118, and/or is formed with the same doping type and/or dopants as the semiconductor substrate 108.

The process for forming the doped semiconductor layer 120 may be, for example, an epitaxial deposition or growth process, such as MOCVD, MBE, or HVPE. Further, the epitaxial deposition or growth process may be, for example, selective, such that the doped semiconductor layer 120 forms on semiconductor material, such as the semiconductor substrate 108 and/or the buffer layer 118, but not on other materials, such as the pad layer 126. In some embodiments, the selective epitaxial deposition or growth process is performed by vapor deposition in which vapor comprising hydrogen chloride (e.g., HCl), dichlorosilane (e.g., DCS), and diborane (e.g., $B_2H_6$) is flowed over the semiconductor substrate 108 and the buffer layer 118.

In some embodiments, the vapor is flowed over the semiconductor substrate 108 and the buffer layer 118 for about 130-170 seconds, such as about 150 seconds. The doping concentration of the doped semiconductor layer 120 may, for example, be linear or proportional with the duration with which the vapor is flowed over the semiconductor substrate 108 and the buffer layer 118. Further, in some embodiments, the vapor is flowed over the semiconductor substrate 108 at a low temperature less than about 700 or 800 degrees Celsius and/or a low pressure less than about 10 or 11 torr. For example, the vapor may be flowed over the semiconductor substrate 108 at a temperature of about 650-750 degrees Celsius and/or at a pressure of about 10.0-10.5 torr. Even more, in some embodiments, the flowrate of diborane is about 1-20 sccm and the flowrate for dichlorosilane is about 3-6 times, such as about 4.3 times, greater than that of hydrogen chloride. For example, the flowrate for diborane may be about 1 sccm, the flowrate for dichlorosilane may be about 150 sccm, and/or the flowrate for hydrogen chloride may be about 35 sccm. The doping concentration of the doped semiconductor layer 120 may, for example, be linear or proportional with the flowrate of diborane.

Figure 8A:
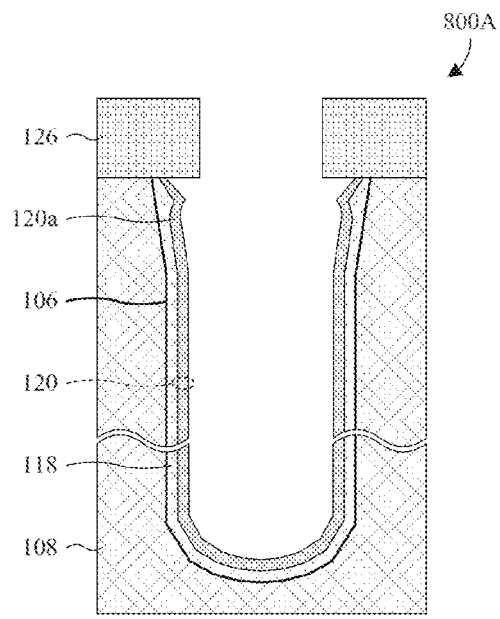
Figure 8B:
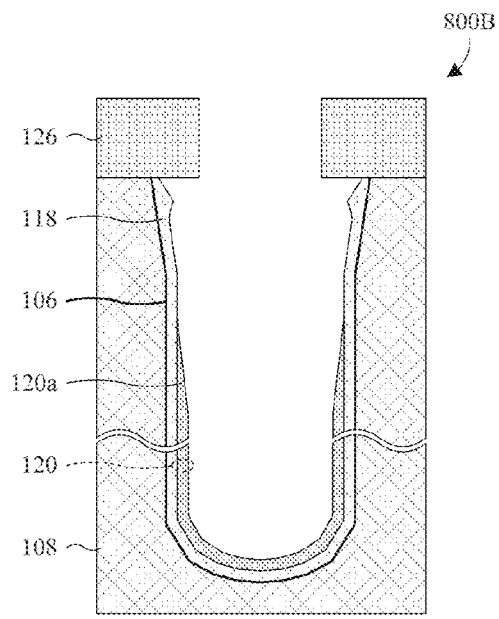
Figure 8C:
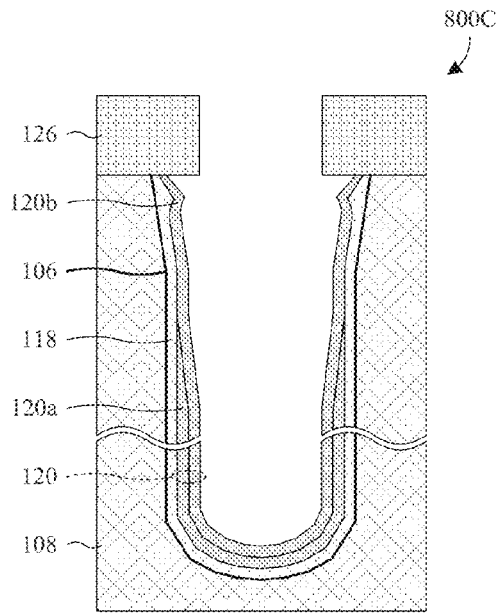

With reference to the cross-sectional views 800A-800C of FIGS. 8A-8C, the doped semiconductor layer 120 is formed according to alternative embodiments of the process for forming the doped semiconductor layer 120. Further, in some embodiments, the doped semiconductor layer 120 is form with a non-uniform doping concentration from top to bottom, examples of which are described in FIGS. 2A-2C.

As illustrated by the cross-sectional view 800A of FIG. 8A, a first doped semiconductor sublayer 120a is formed lining the buffer layer 118. In some embodiments, the first doped semiconductor sublayer 120a is formed confined to the trench 106 and/or with a doping concentration that is uniform from top to bottom. Further, in some embodiments, the first doped semiconductor sublayer 120a is formed of boron-doped monocrystalline silicon. Even more, in some embodiments, the first doped semiconductor sublayer 120a is formed of the same semiconductor material as the semiconductor substrate 108 and/or the buffer layer 118, and/or is formed with the same doping type and/or dopants as the semiconductor substrate 108.

The process for forming the first doped semiconductor sublayer 120a may be, for example, an epitaxial deposition or growth process. Further, the epitaxial deposition or growth process may be, for example, selective, such that the first doped semiconductor sublayer 120a forms on semiconductor material, such as the semiconductor substrate 108 and the buffer layer 118, but not on other materials, such as the pad layer 126. In some embodiments, the selective epitaxial deposition or growth process is the same as that described in FIG. 7. For example, the selective epitaxial deposition or growth process is performed by vapor deposition in which vapor comprising hydrogen chloride (e.g., HCl), dichlorosilane (e.g., DCS), and diborane (e.g., $B_2H_6$) is flowed over the semiconductor substrate 108 and the buffer layer 118.

As illustrated by the cross-sectional view 800B of FIG. 8B, a second etching process is performed into the first doped semiconductor sublayer 120a to etch back an upper or top surface of the first doped semiconductor sublayer 120a relative to an upper or top surface of the semiconductor substrate 108. Advantageously, by etching back the upper or top surface of the first doped semiconductor sublayer 120a, the doping concentration collectively between the first doped semiconductor sublayer 120a and the buffer layer 118 increases from a top of the trench 106 to a bottom of the trench 106.

The second etching process comprises applying an etchant to the first doped semiconductor sublayer 120a. In some embodiments, the etchant is applied to the first doped semiconductor sublayer 120a at a low temperature less than about 700-800 degrees Celsius and/or a low pressure less than about 10 or 11 torr. For example, the etchant may be applied to the first doped semiconductor sublayer 120a at a temperature of about 725 degrees Celsius and/or a pressure of about 10.3 torr. Further, in some embodiments, the etchant is selective or preferential of the first doped semiconductor sublayer 120a relative to the pad layer 126 and/or the buffer layer 118. The etchant may be, for example, a dry etchant or a wet etchant. The dry etchant may be, for example, plasma generated by heating a gas and/or subjecting the gas to a strong electromagnetic field. The gas may be, for example, hydrogen chloride (e.g., HCl) or a mixture comprising hydrogen chloride, dichlorosilane (e.g., DCS), and germane (e.g., $GeH_4$). The wet etchant may be, for example, hydrofluoric acid (HF), buffered oxide etch (BOE) solution, or tetramethylammonium hydroxide (TMAH).

As illustrated by the cross-sectional view 800C of FIG. 8C, a second doped semiconductor sublayer 120b is formed lining the first doped semiconductor sublayer 120a and the buffer layer 118. In some embodiments, the second doped semiconductor sublayer 120b is formed with a doping concentration that is uniform from top to bottom, but different than that of the first doped semiconductor sublayer 120a. For example, the second doped semiconductor sublayer 120b may be formed with a doping concentration less than that of the first doped semiconductor sublayer 120a. Further, in some embodiments, the second doped semiconductor sublayer 120b is formed of boron-doped monocrystalline silicon and/or confined to the trench 106. Even more, in some embodiments, the second doped semiconductor sublayer 120b is formed of the same semiconductor material as the semiconductor substrate 108 and/or the first doped semiconductor sublayer 120a, and/or is formed with the same doping type and/or dopants as the semiconductor substrate 108 and/or the first doped semiconductor sublayer 120a.

The process for forming the second doped semiconductor sublayer 120b may be, for example, an epitaxial deposition or growth process. Further, the epitaxial deposition or growth process may be, for example, selective, such that the second doped semiconductor sublayer 120b forms on semiconductor material, but not on other materials. In some embodiments, the selective epitaxial deposition or growth process is the same as that described in FIG. 7 and/or FIG. 8A. Further, in some embodiments, parameters of the selective epitaxial deposition or growth process are varied from those used for the first doped semiconductor sublayer 120a so the doping concentration of the second doped semiconductor sublayer 120b differs from that of the first doped semiconductor sublayer 120a. For example, the duration of the selective epitaxial deposition or growth may be varied since doping concentration may change (e.g., linearly) with the duration. As another example, the flowrate of diborane may be varied since the doping concentration may also vary (e.g., linearly) with the flowrate of diborane.

Where the second doped semiconductor sublayer 120b has a doping concentration less than that of the first doped semiconductor sublayer 120a, the doping concentration of the doped semiconductor layer 120 advantageously increases from the top of the trench 106 to the bottom of the trench 106. For example, the doped semiconductor layer 120 has the doping concentration of the second doped semiconductor sublayer 120b before the upper or top surface of the first doped semiconductor sublayer 120a, and the doping concentration of the first doped semiconductor sublayer 120a after the upper or top surface.

While the process of FIGS. 8A-8C was illustrated as concluding at FIG. 8C, the process may conclude at FIG. 8B in other embodiments. Further, while the process of FIGS. 8A-8C was illustrated as concluding at FIG. 8C, the process may proceed with an etch back of the second doped semiconductor sublayer 120b in other embodiments. The etch back may, for example, be performed according to acts of FIG. 8B. Further, the etch back may, for example, recess an upper or top surface of the second doped semiconductor sublayer 120b to a location spaced between an upper or top surface of the semiconductor substrate 108 and the upper or top surface of the first doped semiconductor sublayer 120a. Even more, while the process of FIGS. 8A-8C was illustrated with a single formation/etch cycle (corresponding to FIGS. 8A and 8B), one or more additional formation/etch cycles may be performed in other embodiments. Such additional formation/etch cycles may, for example, be performed according to a CDE process to increase the granularity and control over the doping concentration of the doped semiconductor layer 120 from the top of the trench 106 to the bottom of the trench 106.

In some embodiments with multiple formation/etch cycles, a first formation/etch cycle comprises forming a first doped semiconductor sublayer over and lining the buffer layer 118, and subsequently etching back an upper or top surface of the first doped semiconductor sublayer to below an upper or top surface of the semiconductor substrate 108. Thereafter, each additional formation/etch cycle comprises forming an additional doped semiconductor sublayer over and lining the doped semiconductor sublayer of the immediately preceding cycle, where the additional doped semiconductor sublayer has a doping concentration less than that of the doped semiconductor sublayer from the immediately preceding cycle. Further, each additional formation/etch cycle comprises etching back an upper or top surface of the additional doped semiconductor sublayer to a location between the upper or top surface of the semiconductor substrate 108 and the upper or top surface of the doped semiconductor sublayer from the immediately preceding cycle.

Figure 9:
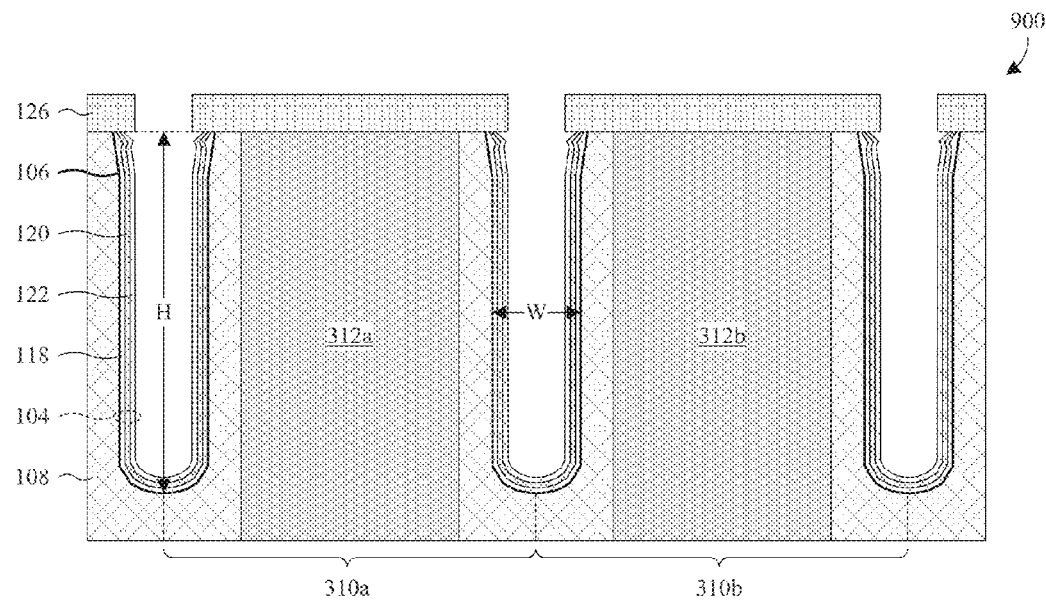

As illustrated by the cross-sectional view 900 of FIG. 9, a capping layer 122 is formed lining the doped semiconductor layer 120 and, in some embodiments, is confined to the trench 106. For example, the capping layer 122 may be formed conformally lining the doped semiconductor layer 120 and/or with an upper or top surface that underlies the pad layer 126. The doped semiconductor layer 120 may be configured as described in FIG. 7 or according to an embodiment of FIGS. 8A-8C. Further, the capping layer 122 is formed of an undoped semiconductor material. For example, the capping layer 122 may be formed of undoped monocrystalline silicon, and/or as the same semiconductor material as the semiconductor substrate 108 and/or the buffer layer 118.

The process for forming the capping layer 122 may be, for example, an epitaxial deposition or growth process, such as MOCVD, MBE, or HVPE. Further, the epitaxial deposition or growth process may be, for example, selective, such that the capping layer 122 forms on semiconductor material, such as the semiconductor substrate 108 and the doped semiconductor layer 120, but not on other materials. In some embodiments, the selective epitaxial deposition or growth process is performed by vapor deposition in which vapor comprising hydrogen chloride (e.g., HCl) and dichlorosilane (e.g., DCS) is flowed over the doped semiconductor layer 120.

In some embodiments, the vapor is flowed over the doped semiconductor layer 120 for about 550-650 seconds, such as about 600 seconds. Further, in some embodiments, the vapor is flowed over the doped semiconductor layer 120 at a low temperature less than about 700 or 800 degrees Celsius and/or a low pressure less than about 10 or 11 torr. For example, the vapor may be flowed over the doped semiconductor layer 120 at a temperature of about 675-775 degrees Celsius and/or at a pressure of about 10.0-10.5 torr. The lower temperature may be, for example, greater than that used to form the buffer layer 118 and/or the doped semiconductor layer 120. The lower pressure may be, for example, about the same as that used during the baking process and/or the formation of the buffer and doped semiconductor layers 118, 120. Even more, in some embodiments, the flowrate for dichlorosilane is about 3-6 times, such as about 4 times, greater than that of hydrogen chloride. For example, the flowrate for dichlorosilane may be, for example, about 200 sccm, and/or the flowrate for hydrogen chloride may be, for example, about 45 sccm. Moreover, the flowrate for hydrogen chloride may be, for example, at least about 15 sccm more than that used by the buffer layer 118 to advantageously improve the selectivity of the epitaxial deposition or growth process, and/or to reduce defects.

The capping layer 122, the doped semiconductor layer 120, and the buffer layer 118 collectively define a tri-layer passivation layer 104. Advantageously, performing the baking process and forming the tri-layer passivation layer 104 as described above reduces undercutting of the pad layer 126 and repairs crystalline defects in the semiconductor substrate 108. This, in turn, reduces dark, reduces white pixels, and increases performance. Further, forming the doped semiconductor layer 120 by epitaxy advantageously allows the doped semiconductor layer 120 to be formed with a uniform doping profile, from top to bottom, when the trench 106 has a height greater than about 1 micrometers and/or an aspect ratio greater than about 5. Even more, forming the doped semiconductor layer 120 by CDE advantageously allows control over the doping profile of the doped semiconductor layer 120. Moreover, forming the tri-layer passivation layer 104 with epitaxy allows the tri-layer passivation layer 104 to be formed at low pressure (e.g., less than about 10 or 11 torr) and/or low temperature (e.g., about less than 700 or 800 degrees Celsius).

Figure 10:
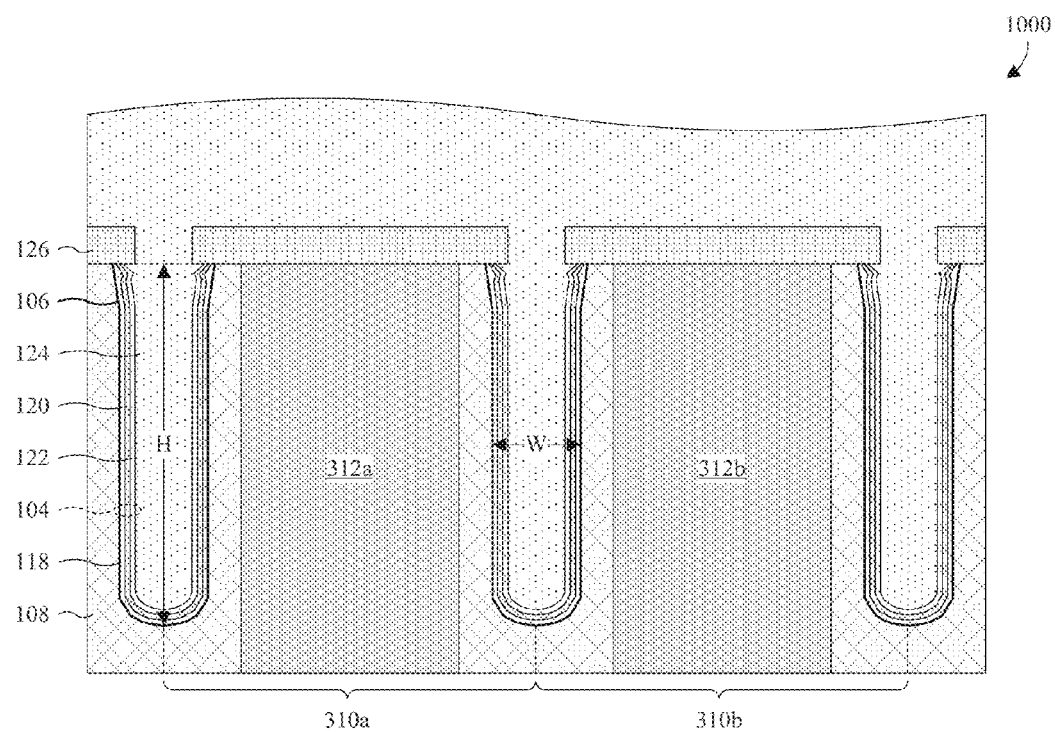

As illustrated by the cross-sectional view 1000 of FIG. 10, a dielectric filler layer 124 is formed filling the trench 106 over the capping layer 122, and further covering the pad layer 126. The dielectric filler layer 124 may, for example, be formed by vapor deposition, such as chemical vapor deposition (CVD) or physical vapor deposition (PVD), sputtering, thermal oxidation, some other deposition or growth process, or a combination of the foregoing.

Figure 11:
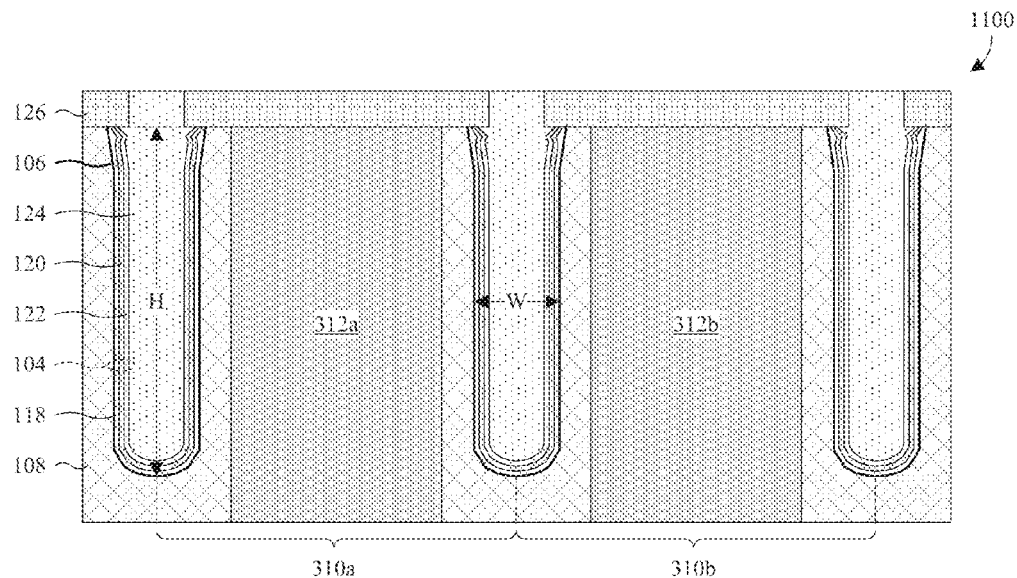

As illustrated by the cross-sectional view 1100 of FIG. 11, a planarization is performed into the dielectric filler layer 124 to coplanarize an upper or top surface of the dielectric filler layer 124 with an upper or top surface of the pad layer 126 or an upper or top surface of the semiconductor substrate 108. As to the latter, the planarization removes the pad layer 126 in some embodiments. The planarization may, for example, comprise a chemical mechanical polish (CMP) and/or an etch back.

Figure 12:
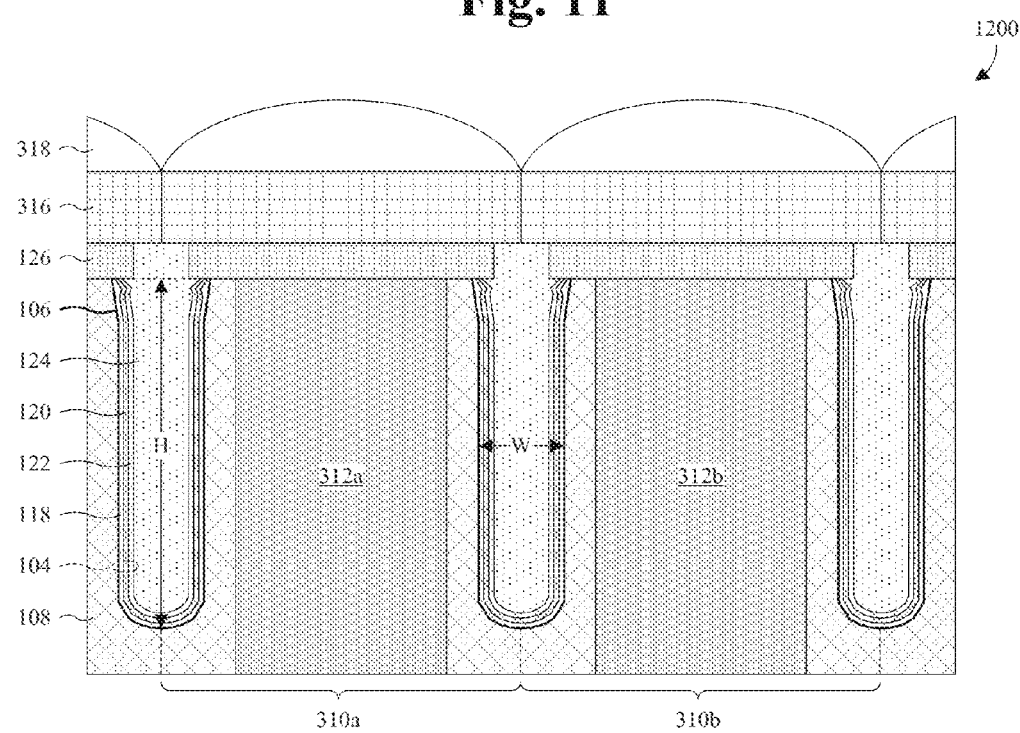

As illustrated by the cross-sectional view 1200 of FIG. 12, color filters 316 and/or microlenses 318 are formed over the semiconductor substrate 108. The color filters 316 are configured to selectively transmit assigned colors or wavelengths of radiation, whereas the microlenses 318 are configured to focus incident radiation on the photodetectors 312a, 312b. Further, in some embodiments, a BEOL interconnect structure (not shown) is first formed over the semiconductor substrate 108, such that the color filters 316 and/or the microlenses 318 are also formed over the BEOL interconnect structure.

Figure 13:
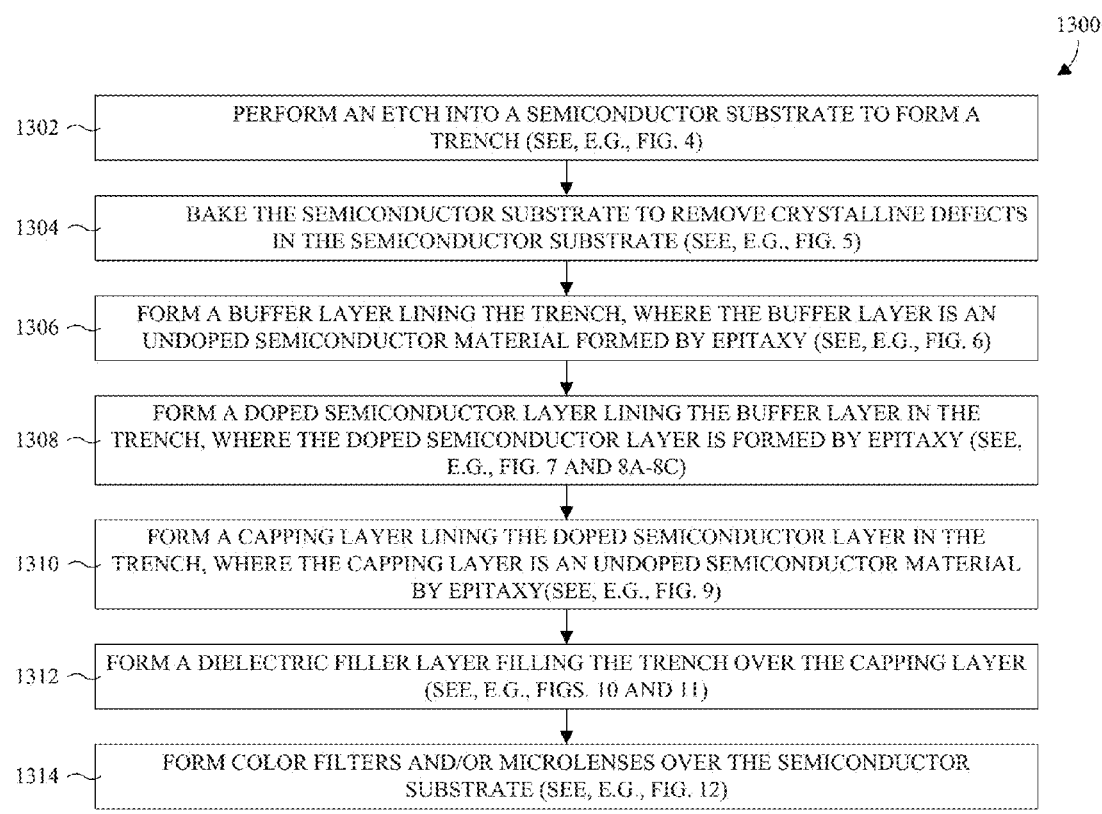
FIG. 13 illustrates a flowchart of some embodiments of the method of FIGS. 4-7, 8A-8C, and 9-12.

With reference to FIG. 13, a flowchart 1300 of some embodiments of the method of FIGS. 4-7, 8A-8C, and 9-12 is provided.

At 1302, an etch is performed into a semiconductor substrate to form a trench. See, for example, FIG. 4.

At 1304, the semiconductor substrate is baked to remove crystalline defects in the semiconductor substrate. See, for example, FIG. 5. In some embodiments, the baking further reduces undercutting of a pad layer used to perform the etch.

At 1306, a buffer layer is formed lining the trench, where the buffer layer is an undoped semiconductor material and formed by epitaxy. See, for example, FIG. 6.

At 1308, a doped semiconductor layer is formed lining the buffer layer in the trench and is formed by epitaxy. See, for example, FIG. 7 and FIGS. 8A-8C. In some embodiments, the doped semiconductor layer is formed with a uniform doping concentration from top to bottom (i.e., a uniform doping profile). In other embodiments, the doped semiconductor layer is formed with non-uniform doping concentration from top to bottom by an etch back and/or a CDE process. Each cycle of the CDE process may comprise, for example, forming a doped semiconductor sublayer and etching back the doped semiconductor sublayer.

At 1310, a capping layer is formed lining the doped semiconductor layer in the trench, where the capping layer is an undoped semiconductor material and formed by epitaxy. See, for example, FIG. 9.

At 1312, a dielectric filler layer is formed filling the trench over the capping layer. See, for example, FIGS. 10 and 11.

At 1314, color filters and/or microlenses are formed over the semiconductor substrate. See, for example, FIG. 12.

While the method described by the flowchart 1300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases. For example, the acts at 1314 may be omitted in some embodiments.

In view of the foregoing, in some embodiments, the present application provides a method for manufacturing a DTI with a tri-layer passivation layer. An etch is performed into a semiconductor substrate to form a trench. A first undoped semiconductor layer is formed lining surfaces of the semiconductor substrate that define the trench. A doped semiconductor layer is formed over and lining the first undoped semiconductor layer in the trench. A second undoped semiconductor layer is formed over and lining the doped semiconductor layer in the trench. The first and second undoped semiconductor layers and the doped semiconductor layer are formed by epitaxy.

Further, in some embodiments, the present application provides a method for manufacturing a DTI structure with a tri-layer passivation layer. A dielectric pad layer is formed over a semiconductor substrate, where the dielectric pad layer has a trench pattern. An etch is performed into the semiconductor substrate, with the dielectric pad layer in place, to form a trench with the trench pattern. The semiconductor substrate is baked to repair crystalline defects on surfaces of the semiconductor substrate that define the trench. A first undoped semiconductor layer is formed in the trench, lining the repaired surfaces of the semiconductor substrate. A doped semiconductor layer is formed over and lining the first undoped semiconductor layer in the trench. A second undoped semiconductor layer is formed over and lining the doped semiconductor layer in the trench. A dielectric filler layer is formed filling the trench over the second undoped semiconductor layer. The first and second undoped semiconductor layers and the doped semiconductor layer are formed by selective epitaxy in which the first and second undoped semiconductor layers and the doped semiconductor layer form on semiconductor material, but not the dielectric pad layer.

Even more, in some embodiments, a semiconductor structure is provided that comprises a semiconductor substrate and a DTI structure. The semiconductor substrate comprises a trench, and the DTI structure fills the trench. The DTI structure comprises a tri-layer passivation layer lining surfaces of the semiconductor substrate defining the trench. The tri-layer passivation layer comprises a pair of undoped semiconductor layers and a doped semiconductor layer sandwiched between the undoped semiconductor layers. Further, the tri-layer passivation layer comprises a (111) facet along a top of the trench. The DTI structure further comprises a dielectric filler layer filling the trench over the tri-layer passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a deep trench isolation (DTI) structure with a tri-layer passivation layer, the method comprising:
   performing an etch into a semiconductor substrate to form a trench;
   forming a first undoped semiconductor layer directly contacting surfaces of the semiconductor substrate that define the trench;
   forming a doped semiconductor layer over and directly contacting the first undoped semiconductor layer in the trench;
   forming a second undoped semiconductor layer over and directly contacting the doped semiconductor layer in the trench; and
   forming a dielectric filler layer filling the trench and directly contacting the second undoped semiconductor layer;
   wherein the first and second undoped semiconductor layers and the doped semiconductor layer are formed by epitaxy.

2. The method according to claim 1, wherein the first and second undoped semiconductor layers and the doped semiconductor layer are formed by selective epitaxy.

3. The method according to claim 1, further comprising:
   before forming the first undoped semiconductor layer, baking the semiconductor substrate to repair crystalline defects on the surfaces of the semiconductor substrate that define the trench.

4. The method according to claim 3, wherein the baking is performed at a temperature that is greater than a temperature used during formation of the first and second undoped semiconductor layers and the doped semiconductor layer.

5. The method according to claim 1, wherein the first and second undoped semiconductor layers and the doped semiconductor layer are formed at a pressure less than about 11 torr and a temperature less than about 750 degrees Celsius.

6. The method according to claim 1, wherein the trench is formed with a height that is greater than about 3 micrometers and that is at least 5 times greater than a width of the trench.

7. The method according to claim 1, wherein the doped semiconductor layer is formed with a doping concentration that is uniform from a top of the trench to a bottom of the trench.

8. The method according to claim 1, wherein the doped semiconductor layer is formed with a doping concentration that increases from a top of the trench to a bottom of the trench.

9. The method according to claim 1, further comprising:
   performing an etch in to the doped semiconductor layer to recess an upper surface of the doped semiconductor layer relative to an upper surface of the semiconductor substrate.

10. A method for manufacturing a deep trench isolation (DTI) structure with a tri-layer passivation layer, the method comprising:
    forming a dielectric pad layer over a semiconductor substrate, wherein the dielectric pad layer has a trench pattern;
    performing an etch into the semiconductor substrate, with the dielectric pad layer in place, to form a trench with the trench pattern;
    baking the semiconductor substrate to repair crystalline defects on surfaces of the semiconductor substrate that define the trench;
    forming a first undoped semiconductor layer in the trench, directly contacting the repaired surfaces of the semiconductor substrate;
    forming a doped semiconductor layer over and directly contacting the first undoped semiconductor layer in the trench;
    forming a second undoped semiconductor layer over and directly contacting the doped semiconductor layer in the trench; and
    forming a dielectric filler layer filling the trench and directly contacting the second undoped semiconductor layer;
    wherein the first and second undoped semiconductor layers and the doped semiconductor layer are formed by selective epitaxy in which the first and second undoped semiconductor layers and the doped semiconductor layer formed on semiconductor material, but not the dielectric pad layer.

11. The method according to claim 10, wherein the first and second undoped semiconductor layers and the doped semiconductor layer are formed at about the same pressure.

12. The method according to claim 10, wherein the doped semiconductor layer is formed by a cyclic-deposition/etch (CDE) process, and wherein the CDE process comprises repeatedly forming and etching back doped semiconductor sublayers.

13. The method according to claim 10, wherein the semiconductor substrate and the doped semiconductor layer have the same doping type.

14. The method according to claim 10, wherein the doped semiconductor layer comprises a plurality of doped semiconductor sublayers stacked upon one another within the trench and having respective u shaped profiles, wherein the doped semiconductor sublayers have individual doping concentration that are uniform from top to bottom, and wherein the individual doping concentrations vary between the doped semiconductor sublayers.

15. The method according to claim 14, wherein the individual doping concentrations decrease from a bottommost one of the doped semiconductor sublayers to an innermost one of the doped semiconductor sublayers.

16. The method according to claim 14, wherein the doped semiconductor sublayers have individual upper surfaces that are recessed below an upper surface of the semiconductor substrate by different recess amounts.

17. The method according to claim 16, wherein the recess amounts decrease from a bottommost one of the doped semiconductor sublayers to an innermost one of the doped semiconductor sublayers.

18. A method for manufacturing a deep trench isolation (DTI) structure with a tri-layer passivation layer, the method comprising:
    performing an etch into a semiconductor substrate to form a trench;
    baking the semiconductor substrate to repair crystalline defects on surfaces of the semiconductor substrate that define the trench;
    forming a first undoped semiconductor layer directly contacting the surfaces of the semiconductor substrate that define the trench;
    forming a doped semiconductor layer over and directly contacting the first undoped semiconductor layer in the trench;
    forming a second undoped semiconductor layer over and directly contacting the doped semiconductor layer in the trench; and
    forming a dielectric filler layer filling the trench and directly contacting the second undoped semiconductor layer;
    wherein the first and second undoped semiconductor layers and the doped semiconductor layer are formed by epitaxy.

19. The method according to claim 18, wherein the baking is performed at a temperature that is greater than a temperature used during formation of the first and second undoped semiconductor layers and the doped semiconductor layer.

20. The method according to claim 18, wherein the first and second undoped semiconductor layers and the doped semiconductor layer are formed at a pressure less than about 11 torr and a temperature less than about 750 degrees Celsius.

\* \* \* \* \*